(12) United States Patent
Matarrese et al.

(10) Patent No.: US 7,180,813 B2
(45) Date of Patent: Feb. 20, 2007

(54) PROGRAMMABLE SYSTEM DEVICE HAVING A SHARED POWER SUPPLY VOLTAGE GENERATOR FOR FLASH AND PLD MODULES

(75) Inventors: Stella Matarrese, San Jose, CA (US); Luca G. Fasoli, San Jose, CA (US); Oron Michael, Campbell, CA (US); Cuong Q. Trinh, Fremont, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 11/012,521

(22) Filed: Dec. 15, 2004

(65) Prior Publication Data

US 2006/0126415 A1 Jun. 15, 2006

(51) Int. Cl.
G11C 5/14 (2006.01)
(52) U.S. Cl. .................. 365/226; 365/185.01; 326/38; 326/39; 326/40; 326/41
(58) Field of Classification Search .............. 365/226, 365/185.01; 326/39, 38, 40, 41
See application file for complete search history.

(56) References Cited

U.S. PATENT DOCUMENTS

| 4,761,768 A | 8/1988 | Turner et al. |
|---|---|---|
| 4,833,646 A | 5/1989 | Turner |
| 4,855,945 A | 8/1989 | Sakai |
| 4,855,954 A * | 8/1989 | Turner et al. .................. 326/38 |
| 4,912,677 A | 3/1990 | Itano et al. |
| 5,563,827 A * | 10/1996 | Lee et al. ............... 365/185.23 |
| 5,574,857 A | 11/1996 | Ramakrishnan et al. |
| 5,982,683 A | 11/1999 | Watson et al. |
| 6,282,122 B1 | 8/2001 | Sansbury |
| 6,710,621 B2 * | 3/2004 | Devlin et al. .................. 326/38 |
| 6,856,542 B2 | 2/2005 | Roy et al. |
| 2003/0222309 A1 | 12/2003 | Roy et al. |
| 2005/0237083 A1 * | 10/2005 | Bakker et al. ................ 326/47 |

\* cited by examiner

Primary Examiner—Richard Elms
Assistant Examiner—Eric J. Wendler
(74) Attorney, Agent, or Firm—Lisa K. Jorgenson; Andre M. Szuwalski

(57) ABSTRACT

A programmable system device includes an embedded FLASH memory module and an embedded programmable logic device (PLD) module. A sole embedded power supply voltage generator generates a plurality of voltages for use by the FLASH memory module and the PLD module during programming, reading and erasing operations. A switching network receives at least some of the generated voltages and selectively chooses among and between the received generated voltages for application to the FLASH memory module and the PLD module depending on whether that particular module is engaged in programming, reading or erasing operations. A load adjustment circuit controls operation of the sole power supply voltage generator based on whether the generated voltages are being used by the FLASH memory module or the PLD module to account for differences in loading between the FLASH memory module and the PLD module during programming, reading and erasing operations. A voltage trimming circuit controls operation of the sole embedded power supply voltage generator to make adjustments in voltage level for at least some of the generated voltages depending on whether those generated voltages are being used by the FLASH memory module or the PLD module during programming, reading and erasing operations.

28 Claims, 3 Drawing Sheets

PROGRAMMABLE SYSTEM DEVICE HAVING A SHARED POWER SUPPLY VOLTAGE GENERATOR FOR FLASH AND PLD MODULES

BACKGROUND OF THE INVENTION

1. Technical Field of the Invention

The present invention relates to a programmable system device (PSD) which includes both a FLASH module and programmable logic device (PLD) module.

2. Description of Related Art

Reference is now made to FIG. 1 wherein there is shown a block diagram of a prior art programmable system device (PSD) 10. The PSD 10 is an integrated circuit in which is embedded both a FLASH memory module 12 and a programmable logic device (PLD) module 14. The PSD 10 may further include other modules 16.

In a preferred, but not necessarily required, implementation, the PLD cells within the PLD module 14 are built using a series of FLASH cells and a CMOS transistor. Such a design is taught by co-pending and commonly assigned published Application for Patent 20030222309 entitled "Programmable Logic Device Circuit and Method of Making Same", by A. Roy and L. Fasoli, the disclosure of which is hereby incorporated by reference.

As is well known to those skilled in the art, a FLASH cell within the FLASH memory module 12 requires a multitude positive and negative voltages to be applied, in precise ways, in order to program, erase or read the cell. To that end, the FLASH memory module 12 includes a power supply voltage generator 18 receives analog voltages and clocks that are common for the PSD 10 and utilizes charge pumps and current and voltage regulator circuits well known in the art to generate a multitude of voltages 26 useful in programming, erasing and reading operations. For example, FLASH cells require a voltage, referred to here as VXP, which is the voltage that is applied to a word line of the cell when programming the cell (typically, for a given technology, about 8.75 volts). FLASH cells further require a voltage, referred to here as VXR, which is the voltage that is applied to the word line of the cell when reading the cell (typically, for a given technology, about 4.5 volts). Still further, FLASH cells require a voltage, referred to here as VY, which is the Y-decoding transistor(s) gate voltage (typically, for a given technology, about 4.5 or 9 volts depending on operating mode). FLASH cells also require a voltage, referred to here as VNEG, which is a negative voltage applied to a p-well within which the word line decoder/driver circuit is implemented and to the gate of the cell being erased (typically, for a given technology, about −9 volts). Additionally, FLASH cells require a voltage, referred to here as VPWNEG, which is a negative voltage applied to a p-well within which the FLASH cell is implemented (typically, for a given technology, about −1.2 volts). Also, FLASH cells require a voltage, referred to here as VPD, which is a drain programming voltage applied to the bit lines of the FLASH cell (typically, for a given technology, about 4.25 volts). The foregoing identified voltages are exemplary and it is noted that other voltages may additionally be needed. However, each needed voltage is provided by the power supply voltage generator 18 or is derived from the voltages provided by the power supply voltage generator.

The FLASH memory module 12 further includes a power management logic circuit 20 which contains a section to decode the module operation commands 22 and a microcontroller that, based on the command being decoded, executes a program/erase routine and generates logic signals 24 that are applied to the power supply voltage generator 18. The logic signals 24 relate to a certain operational mode of the FLASH memory module 12 and tell the power supply voltage generator 18 to generate the proper voltages (VXP, VXR, etc., as discussed above) 26 for application to FLASH cells within a FLASH array 28. The module operation commands 22 are generated by a FLASH user interface 30 which receives user commands relating to FLASH memory module 12 operation, understands those commands and the generates the module operation commands 22 which cause implementation of the user commands by the module 12.

Some of the voltages 26 are selectively applied to the FLASH array 28 depending upon the mode of operation being implemented with respect to the FLASH cells. An example of this relates to the VXP and VXR voltages. In a programming mode of operation, the VXP voltage is connected to the word line. In a read mode of operation, on the other hand, the word line receives the VXR voltage. Other examples of selective application of voltages 26 will be recognized by those skilled in the art. To accomplish this selective application of the voltages 26 to the FLASH array 28, the FLASH memory module 12 further includes a first level of switching implemented through a first switching circuit 32 which includes a plurality of individual switches that receive certain ones of the plural voltages 26 and then selectively output certain ones of those voltages 34 for application to the array 28. With respect to the word line example above, an individual switch in the circuit 32 would function to choose between the VXP and VXR voltages depending on whether the array was user selected to be in programming or read mode, respectively. Other voltage switching operations with respect to the voltages 26 will be recognized by those skilled in the art.

The FLASH array 28 may be divided into a plurality of memory banks 36. In an exemplary implementation, two such memory banks 36 (Bank A and Bank B) are shown. Separate control may be exercised over each of the included banks 32, and thus separate control over the application of power supply voltage generator 18 voltages 26 to each bank must be supported. The first switching circuit 32 of the FLASH memory module 12 accordingly may include a separate a set of switches (for example, Set A and Set B) for each included memory bank. Responsive to control signals 38, the switches within the first switching circuit 32 operate make the appropriate voltage 26 selections for application 34 to the array 28 (and more particularly to the banks 36 therein) to implement a desired mode of operation.

Each bank 36 within the array may further include a plurality of sectors 40 within which the FLASH cells are arrayed. To ensure the application of proper voltages at the FLASH cell and driver level, the FLASH array 28 includes a second switching circuit 42. This second switching circuit 42 may include switches that are operable on an individual sector 40 basis, as well as switches that are operable across multiple sectors (for example, a sector group). The second switching circuit 42 operates in a manner similar to the first switching circuit 32 in that it functions responsive to control signals 44 to make the appropriate voltage 26/34 selections for application to the array 28 (and more particularly within the sectors 40 therein) to implement a desired mode of operation.

The control signals 38 and 44 are generated within the FLASH memory module 12 in response to user commands relating to FLASH memory module 12 operation received by the FLASH user interface 30. These control signals 38 and 44 may be generated by the power management logic 20 or by other control logic 46 resident within the FLASH memory module 12.

The PLD module 14 within the PSD 10 includes an array 128 of PLD cells. As discussed above, the PLD cells within the PLD module 14 may be built using a series of FLASH cells and a CMOS transistor. Given such a configuration, the PLD module 14, like the FLASH module 12, would require a multitude positive and negative voltages to be applied, in precise ways, in order to program, erase or read each cell. Even in other known non-FLASH-related configurations, the PLD module 14 would still require access to a number of voltages to ensure proper operation. Thus, the PLD module 14, like the FLASH module 12, uses a power supply voltage generator 118 which receives analog voltages and clocks that are common for the PSD 10 and utilizes charge pumps and voltage regulator schemes well known in the art to generate a multitude of voltages 126 useful in programming, erasing and reading operations. For example, with a PLD module 14 implemented using FLASH technology, the same types of voltages described above and known to those skilled in the art, such as, for example, the VXP voltage (typically, for a given technology, 8.75 volts), the VXR voltage (typically, for a given technology, 4.5 volts), the VY voltage (typically, for a given technology, 4.5 or 9 volts, depending on operational mode), the VNEG voltage (typically, for a given technology, −9 volts), the VPWNEG voltage (typically, for a given technology, 0.8 volts), and the VPD voltage (typically, for a given technology, 4.2 volts), are also needed for the PLD module 14. In the common PSD 10 architecture, the generators 18 and 118 are separately implemented on the integrated circuit because the PLD and FLASH cells are built in a different way (for example, FLASH versus EEPROM or SRAM). The generators 18 and 118 are also separately implemented due to the fact that the voltage requirements of FLASH and PLD are in some operating modes different.

With a separate generator 118, the PLD module 14 further includes its own power management logic circuit 120 which receives module operation commands 122 and translates those commands to values 124 that are applied to the power supply voltage generator 118. The values 124 relate to a certain operational mode of the PLD module 14 and tell the power supply voltage generator 118 to generate the proper voltages (for example, VXP, VXR, etc., as discussed above) 126 for application to PLD cells within the array 128. The module operation commands 122 are generated by a PLD user interface 130 which receives user commands relating to PLD module 14 operation, understands those commands (perhaps through a decoding operation) and the generates the module operation commands 122 which cause implementation of the user commands by the module 14.

Some of the voltages 126 are selectively applied to the PLD array 128 depending upon the mode of operation being implemented with respect to the PLD cells. To accomplish this selective application of the voltages 126 to the PLD array 128, the PLD module 14 further includes a first level of switching implemented through a first switching circuit 132 which includes a plurality of individual switches that receive certain ones of the plural voltages 126 and then selectively output certain ones of those voltages 134 for application to the array 128. Responsive to control signals 138, the switches within the first switching circuit 132 operate make the appropriate voltage 126/134 selections for application to the array 128 to implement a desired mode of operation.

The PLD array 128 may include a plurality of sectors 140 within which the PLD cells are arrayed. To ensure the application of proper voltages at the PLD cell level, the PLD array 128 includes a second switching circuit 142. This second switching circuit 142 may include switches that are operable on an individual sector 140 basis, as well as switches that are operable across multiple sectors (for example, a sector group). The second switching circuit 142 operates in a manner similar to the first switching circuit 132 in that it functions responsive to control signals 144 to make the appropriate voltage 126/134 selections for application to the array 128 (and more particularly within the sectors 140 therein) to implement a desired mode of operation.

The control signals 138 and 144 are generated within the PLD module 14 in response to user commands relating to PLD module 14 operation received by the PLD user interface 130. These control signals 138 and 144 may be generated by the power management logic 120 or by other control logic 146 resident within the PLD module 14.

The PSD 10 architecture illustrated in FIG. 1 leaves much to be desired. The presence of two separate power supply voltage generators 18 and 118 occupies a significant amount of real estate on the integrated circuit chip (for example, due to the duplication of the pump circuitry necessary to generate a plurality of different voltages). Additionally, testing of such an integrated circuit is time consuming. Still further, the presence of large amounts of analog circuitry as is needed in the generators increases the complexity of the chip design, increases the cost of design and manufacture, and increases the risk of defect. Lastly, an integrated circuit containing plural voltage generator circuit consumes a significant amount of power.

A need accordingly exists in the art for an improved power supply solution for use in multi-module integrated circuits like PSDs. There would be an advantage if a single power supply could be provided and shared by the included modules.

SUMMARY OF THE INVENTION

In accordance with an embodiment of the invention, a programmable system device comprises a FLASH memory module and a programmable logic device (PLD) module. A sole power supply voltage generator generates a plurality of voltages for use by the FLASH memory module and the PLD module during programming, reading and erasing operations. A switching network receives at least some of the generated voltages and selectively chooses among and between the received generated voltages for application to the FLASH memory module and the PLD module depending on whether that particular module is engaged in programming, reading or erasing operations.

In accordance with another embodiment of the invention, a programmable system device comprises a FLASH memory module and a programmable logic device (PLD) module. A sole power supply voltage generator generates a plurality of voltages for use by the FLASH memory module and the PLD module during programming, reading and erasing operations. A load adjustment circuit controls operation of the sole power supply voltage generator based on whether the generated voltages are being used by the FLASH memory module or the PLD module to account for differences in loading between the FLASH memory module and the PLD module during programming, reading and erasing operations.

In accordance with another embodiment of the invention, a programmable system device comprises a FLASH memory module and a programmable logic device (PLD) module. A sole power supply voltage generator generates a plurality of voltages for use by the FLASH memory module and the PLD module during programming, reading and erasing operations. A voltage trimming circuit controls operation of the sole embedded power supply voltage generator to make adjustments in voltage level for at least some of the generated voltages depending on whether those generated voltages are being used by the FLASH memory module or the PLD module during programming, reading and erasing operations.

In accordance with another embodiment of the invention, a programmable system device comprises a FLASH memory module including a circuit responsive to user selection for generating power supply operation commands indicative of whether programming, reading or erasing operations are to be performed by the FLASH memory module, and a programmable logic device (PLD) module including a circuit responsive to user selection for generating power supply operation commands indicative of whether programming, reading or erasing operations are to be performed by the PLD module. A sole power supply voltage generator generates a plurality of voltages for use by the FLASH memory module and the PLD module during programming, reading and erasing operations. A FLASH/PLD interface logic circuit operates to arbitrate between the FLASH and PLD power supply operation commands before application to the sole power supply voltage generator.

BRIEF DESCRIPTION OF THE DRAWINGS

A more complete understanding of the invention may be obtained by reference to the accompanying drawings wherein.

DETAILED DESCRIPTION OF THE DRAWINGS

Figure 2:
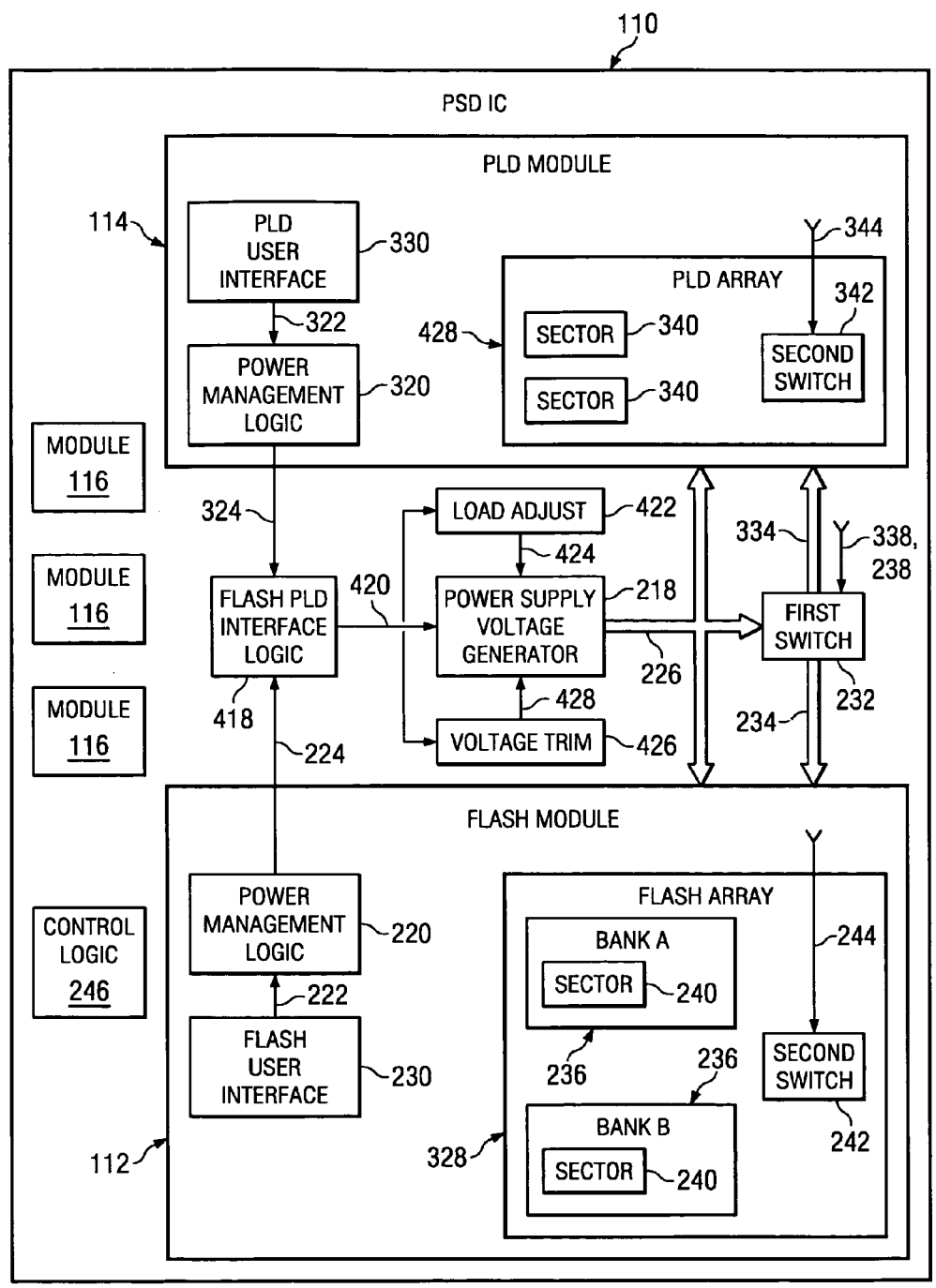
FIG. 2 is a block diagram of an embodiment of a programmable system device (PSD) including an embedded FLASH memory module and programmable logic device (PLD) module.

Reference is now made to FIG. 2 wherein there is shown a block diagram of a programmable system device (PSD) 110. The PSD 110 is an integrated circuit in which is embedded both a FLASH memory module 112 and a programmable logic device (PLD) module 114. The PSD 110 may further include other modules 116.

In a preferred, but not necessarily required, implementation, the PLD cells within the PLD module 114 are built using a series of FLASH cells and a CMOS transistor. Such a design is taught by co-pending and commonly assigned published Application for Patent 20030222309 entitled "Programmable Logic Device Circuit and Method of Making Same", by A. Roy and L. Fasoli, the disclosure of which is hereby incorporated by reference.

Figure 1:
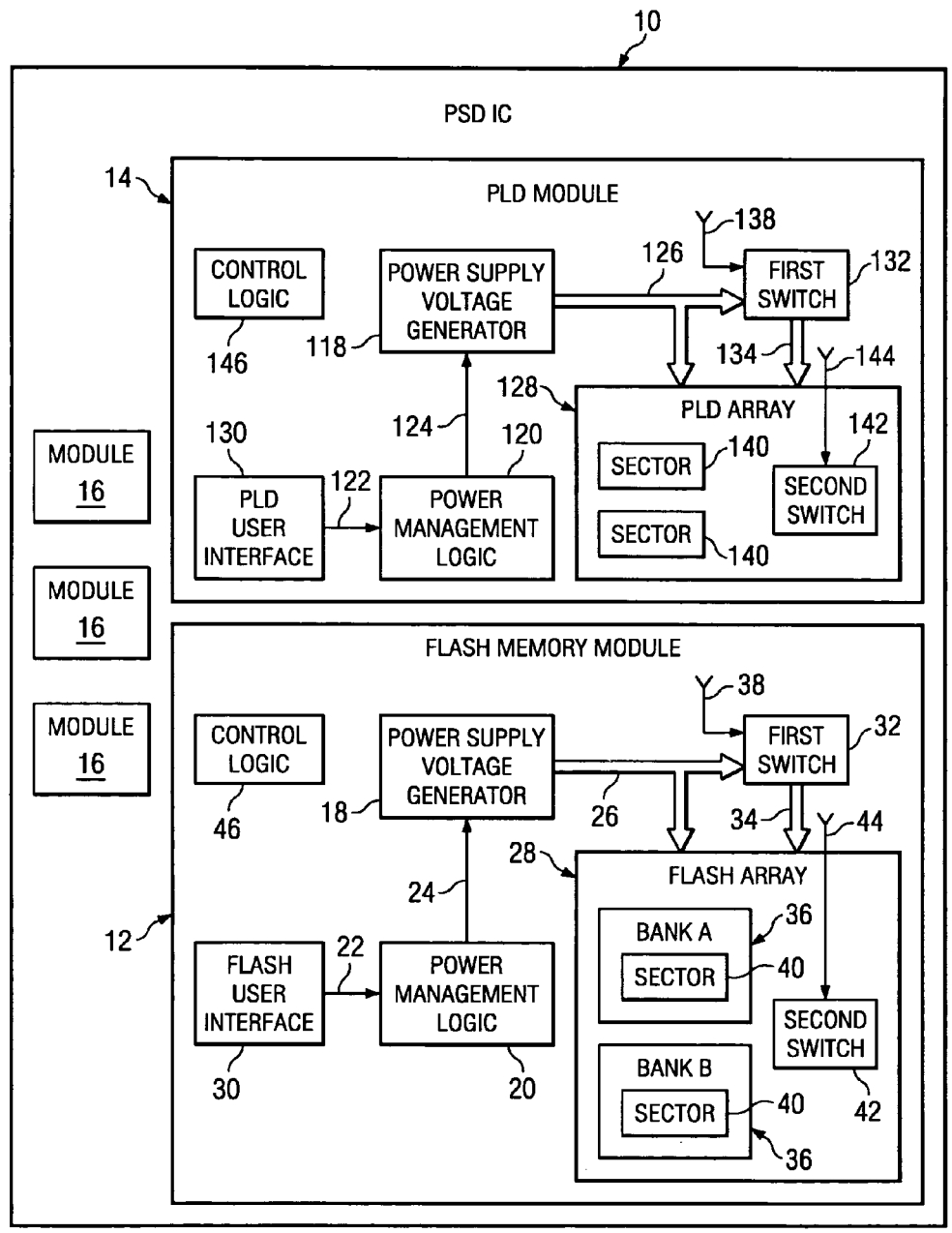
FIG. 1 (previously described) is a block diagram of a prior art programmable system device (PSD) including an embedded FLASH memory module and programmable logic device (PLD) module.

As is well known to those skilled in the art, a FLASH cell within the FLASH memory module 112 and a PLD cell within the PLD module 114 both require a multitude positive and negative voltages to be applied, in precise ways, in order to program, erase or read the cell. As shown in FIG. 1, prior art PSD 10 architectures utilize separate power supply voltage generators for the included FLASH/PLD modules. Recognizing that the voltage needs of the FLASH module 112 and the PLD module 114 are at the very least similar (and in some cases identical), the PSD 110 architecture shown in FIG. 2 advantageously provides a single power supply voltage generator 218 that can be shared between the FLASH module 112 and the PLD module 114.

The power supply voltage generator 218 receives analog voltages and clocks that are common for the PSD 110 and utilizes charge pumps and voltage regulator schemes well known in the art to generate a multitude of voltages 226 useful in programming, erasing and reading operations in both the FLASH array 328 and the PLD array 428. In an embodiment where both arrays 328 and 428 are implemented using FLASH technology, the individual cells (and accompanying circuitry) within the arrays require a number of common voltages. Examples of such voltages include: the VXP voltage that is applied to a word line of the cell when programming the cell; the VXR voltage that is applied to the word line of the cell when reading the cell; the VY voltage that is the transistor gate voltage applied during Y-decoding operations; the VNEG voltage that is applied to a p-well within which the word line decoder/driver circuit is implemented; the VPWNEG voltage that is applied to a p-well within which the cell is implemented; and the VPD voltage that is a drain programming voltage applied to the bit lines of the cell. The foregoing identified voltages are exemplary and it is noted that other voltages may additionally be needed. However, each needed voltage is provided by the power supply voltage generator 218 or is derived from the voltages provided by the power supply voltage generator.

Some of the voltages 226 are selectively applied to the arrays 328 and 428 depending upon the mode of operation being implemented with respect to the included cells. To accomplish this selective application of the voltages 226 to each of the arrays 328 and 428, the PSD 110 includes a first level of switching implemented through a first switching circuit 232 which includes a plurality of individual switches that receive certain ones of the plural voltages 226 and then selectively output certain ones of those voltages for application 234 and 334 to the arrays 328 and 428, respectively. Such selective voltage application may be driven, for example, by whether the array is in programming or read mode. Other voltage switching operations with respect to the voltages 226, and their application 234 and 334 to the arrays 328 and 428, will be recognized by those skilled in the art.

The FLASH array 328 may be divided into a plurality of memory banks 236. In an exemplary implementation, two such memory banks 236 (Bank A and Bank B) are shown. Separate control may be exercised over each of the included banks 236, and thus separate control over the application of power supply voltage generator 218 voltages 226 to each bank must be supported. The first switching circuit 232 of the PSD 110 accordingly may include a separate a set of switches (for example, Set A and Set B) for each included memory bank. Responsive to control signals 238, the switches within the first switching circuit 232 operate make the appropriate voltage 226 selections for application 234 to the array 328 (and more particularly to the banks 236 therein) to implement a desired mode of operation.

Separate control may also be exercised over the PLD array 428, and thus separate control over the application of power supply voltage generator 218 voltages 226 to the array 428 must be supported. The first switching circuit 232 of the PSD 110 accordingly may further include a separate a set of switches (for example, Set C) for the array 428. Responsive to control signals 338, the switches within the first switching circuit 232 operate make the appropriate voltage 226 selections for application 334 to the array 428 to implement a desired mode of operation.

Each bank 236 within the FLASH array 328 may further include a plurality of sectors 240 within which the FLASH cells are arrayed. To ensure the application of proper voltages at the FLASH cell and driver level, the FLASH array 328 includes a second switching circuit 242. This second switching circuit 242 may include switches that are operable on an individual sector 240 basis, as well as switches that are operable across multiple sectors (for example, a sector group). The second switching circuit 242 operates in a manner similar to the first switching circuit 232 in that it functions responsive to control signals 244 to make the appropriate voltage 226/234 selections for application to the array 328 (and more particularly within the sectors 240 therein) to implement a desired mode of operation.

The PLD array 428 may include a plurality of sectors 340 within which the PLD cells are arrayed. To ensure the application of proper voltages at the PLD cell level, the PLD array 428 includes a second switching circuit 342. This second switching circuit 342 may include switches that are operable on an individual sector 340 basis, as well as switches that are operable across multiple sectors (for example, a sector group). The second switching circuit 342 operates in a manner similar to the first switching circuit 232 in that it functions responsive to control signals 344 to make the appropriate voltage 226/334 selections for application to the array 428 (and more particularly within the sectors 340 therein) to implement a desired mode of operation.

Although a plurality of banks are not illustrated with respect to the organization of the PLD array 428 (in essence showing just a single Bank C), it will be understood that the array 428 may include multiple banks (with each bank including multiple sectors) if desired. In such an implementation, the first switching circuit 232 would include sufficient additional structure for exercising separate control over the application of power supply voltage generator 218 voltages 226 to each bank within the array 428. The included structure would be similar to the structure present within the first switching circuit 232 for controlling the application of voltages to the multiple banks 236 within the FLASH array 328.

The FLASH memory module 112 further includes a power management logic circuit 220 which receives module operation commands 222 and translates those commands to values 224 that relate to a certain operational mode of the FLASH memory module 112. The module operation commands 222 are generated by a FLASH user interface 230 which receives user commands relating to FLASH memory module 112 operation, understands those commands (perhaps through a decoding operation) and the generates the module operation commands 222 which cause implementation of the user commands by the module 112.

The PLD module 114 further includes a power management logic circuit 320 which receives module operation commands 322 and translates those commands to values 324 that relate to a certain operational mode of the PLD module 114. The module operation commands 322 are generated by a PLD user interface 330 which receives user commands relating to PLD module 114 operation, understands those commands (perhaps through a decoding operation) and the generates the module operation commands 322 which cause implementation of the user commands by the module 114.

The PSD 110 includes a FLASH/PLD interface logic circuit 418 which receives the FLASH module operation commands 222 from the FLASH power management logic 220 and the PLD module operation commands 322 from the PLD power management logic 320. These commands 222 and 322 in general relate to specific operations to be performed by the FLASH memory module 112 and the PLD module 114, respectively, and in particular relate to commanding the power supply voltage generator 218 to generate the proper voltages 226 for application to FLASH cell and PLD cells within the arrays 328 and 428. The FLASH/PLD interface logic circuit 418 combines the commands 222 and 322 together in a logical and practical manner so that the power supply voltage generator 218 knows what voltages 226 need to be generated for application to FLASH cell and PLD cells within the arrays 328 and 428 so that the FLASH memory module 112 and the PLD module 114 perform the functions specified by the user through the user interfaces 230 and 330. In essence, the FLASH/PLD interface logic circuit 418 coordinates the commands 222 and 322, and when necessary arbitrates between those commands in the event of a conflict, so as to generate consolidated FLASH/PLD commands 420 for application to the power supply voltage generator 218.

There are practical issues which need to be addressed with respect to the differences between supplying voltages to a FLASH module 112 and supplying voltages to a PLD module 114. For example, the capacitance loads on the power supply voltage generator 218 can change quite significantly at a given point in time depending on whether FLASH module 112 is operating or the PLD module 114 is operating. When a single power supply voltage generator 218 is used, its operation must be adjusted to account for these load differences. To that end, the PSD 110 further includes a load adjustment circuit 422 that receives the FLASH/PLD commands 420 so that it knows at any given time whether the FLASH module 112 is operational or the PLD module 114 and generates load adjustment signal(s) 424 which are applied to the power supply voltage generator 218 so as to adjust generator operation to account for module loading differences. As an example, in response to the load adjustment signal(s) indicative of an active PLD module 114 operation at the given time, the power supply voltage generator 218 operation is adjusted in a manner which makes the PLD array 428, which typically is much smaller than the FLASH array 328, "look like" the FLASH array from a loading perspective. This may be accomplished, for example, by connecting extra capacitance on the line bringing the voltage source to the PLD.

Another practical issue concerns slight differences in voltage level needs between the FLASH memory module 112 and the PLD module 114. It is recognized that certain ones of the voltages 226 generated by the power supply voltage generator 218 have common uses in the FLASH memory module 112 and the PLD module 114. For example, the bit line voltage VPD which is applied when a cell is selected for programming is typically 4.25 volts for the FLASH memory module 112 and 4.20 volts for the PLD module 114. As another example, a voltage derived from VPWNEG is −1.2 volts for FLASH operation and −0.8 volts for PLD operation because one must account for the voltage drop across a series transistor which is present in the PLD configuration. These voltage differences are not insignificant and must be accounted for by the PSD 110 in order to ensure proper operation. Other examples of differences in voltage levels between the FLASH memory module 112 and the PLD module 114 will be recognized by those skilled in the art. Thus, when a single power supply voltage generator 218 is used, its operation must be adjusted to account for these voltage level differences. To that end, the PSD 110 further includes a voltage trimmer circuit 426 that receives the FLASH/PLD commands 420 so that it knows at any given time whether the FLASH module 112 is operational or the PLD module 114 and generates voltage trim signal(s) 428 which are applied to the power supply voltage generator 218 so as to adjust generator operation to account for module voltage level differences. With reference to the foregoing VPD example, in response to the voltage trim signal(s) indicative of an active PLD module 114 operation at the given time, the power supply voltage generator 218 operation is adjusted in a manner which ensures that the generated VPD voltage is 4.20 volts and not 4.25 volts. Similarly, with reference to the foregoing VPWNEG example, in response to the voltage trim signal(s) indicative of an active PLD module 114 operation at the given time, the power supply voltage generator 218 operation is adjusted in a manner which ensures that the generated VPWNEG voltage is −0.8 volts and not −1.2 volts. The voltage trimming operation is accomplished, for example, by setting a different value for the control signals entering the voltage regulator which controls the level to be generated for a particular power supply voltage.

The control signals 238, 338, 244 and 344 are generated within the PSD 110 (for example, within the FLASH memory module 112 and/or PLD module 114) in response to user commands relating to module 112/114 operation as received by the FLASH user interface 230 and/or PLD user interface 330. These control signals 238, 338, 244 and 344 may be generated by the power management logic 220/320, the FLASH/PLD interface logic 418 or by other control logic 246 resident within the PSD 110 (for example, within the FLASH memory module 112 and/or PLD module 114).

Figure 3:
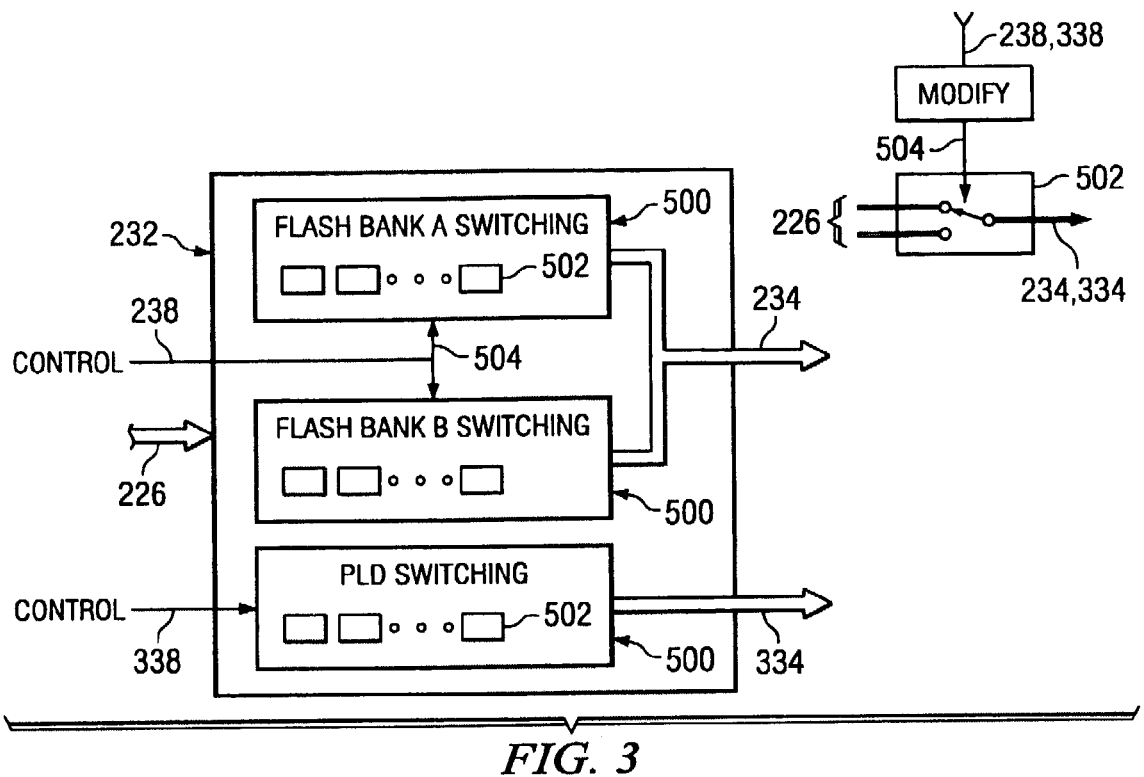
FIG. 3 is a block diagram of the first switching circuit of the PSD.

Reference is now made to FIG. 3 wherein there is shown a block diagram of the first switching circuit 232 of the PSD 110. The switching circuit 232 includes a sub-switching network 500 for each of the banks 236 within the FLASH array 328 and each PLD array 428 (assuming, as discussed above, that the array 428 includes only a single bank). Each sub switching network 500 receives at least some of the voltages 226 generated by the power supply voltage generator 218. The received ones of the voltages 226 are selectively connected to the inputs of individual switches 502, where the switching operation of each individual switch to select one of the input voltages for output is controlled by a received modify signal 504. Each modify signal 504, and they may be different for different sub-switching networks 500, comprises one of the control signals 238/338. Responsive to the modify signal 504, the individual switches 502 within each sub-switching network 500 make an input to output voltage selection to generate the voltages which are selectively being applied 234 and 334 to the arrays 328 and 428, respectively.

As an example, each sub-switching network 500 receives the VXP and the VXR voltages which are part of the voltages 226 generated by the power supply voltage generator 218. It will be remembered from the discussion above that the VXP and VXR voltages are voltages which are applied to the cell word line the programming and reading operations, respectively. These two voltages are connected to the inputs of an individual switch 502 within each sub-switching network 500. The received modify signal 504 would be indicative of whether the FLASH bank 236 or PLD array 428 was user selected to be in programming/read mode, and responsive thereto connect through the switch the appropriate VXP/VXR voltage as the applied 234/334 voltage (VXP_x) for connection to the cell word line(s). Other examples of voltage 226 selections to be made at the level of the first switching circuit 232 will be readily apparent to those skilled in the art.

Figure 4:
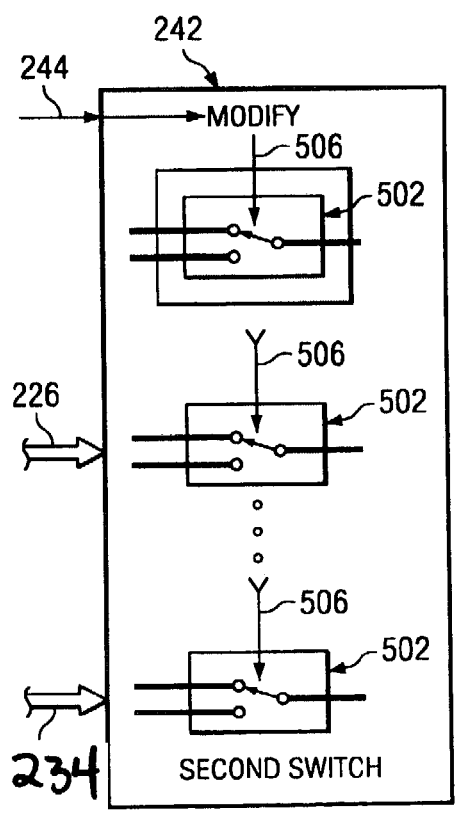
FIG. 4 is a block diagram of the second switching circuit of the FLASH memory array.

Reference is now made to FIG. 4 wherein there is shown a block diagram of the second switching circuit 242 of the FLASH memory array 328. The second switching circuit 242 receives at least some of the voltages 226 generated by the power supply voltage generator 218 (which may bypass first switching circuit 232) as well as at least some of the voltages 234 which were output from the first switching circuit 232. The received ones of the voltages 226/234 are selectively connected to the inputs of individual switches 502, where the switching operation of each individual switch to select one of the input voltages for output is controlled by a received modify signal 506. Each modify signal 506, and they may be different for different ones of the switches 502, comprises one of the control signals 244. Responsive to the modify signal 506, the individual switches 502 make an input to output voltage selection to generate the voltages which are selectively applied to individual cells within the sectors 240 (or to all cells in a sector, or to all cells in multiple sectors) of a selected bank 236 in the FLASH array 328.

Figure 5:
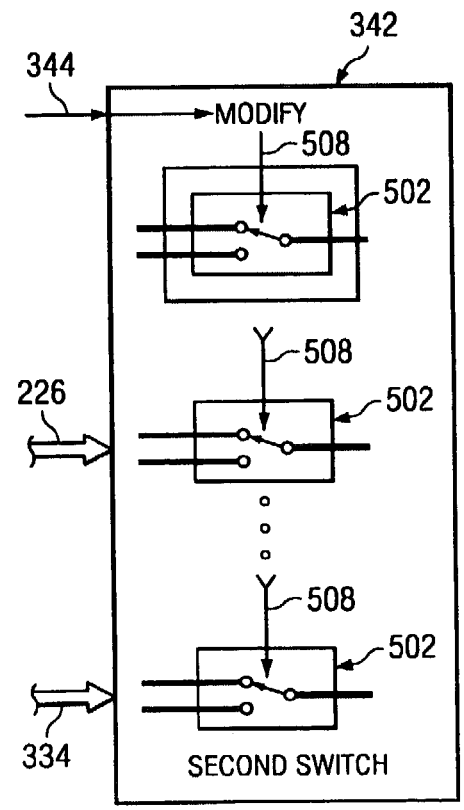
FIG. 5 is a block diagram of the second switching circuit of the PLD array.

Reference is now made to FIG. 5 wherein there is shown a block diagram of the second switching circuit 342 of the PLD array 428. The second switching circuit 342 receives at least some of the voltages 226 generated by the power supply voltage generator 218 (which may bypass first switching circuit 232) as well as at least some of the voltages 334 which were output from the first switching circuit 232. The received ones of the voltages 226/234 are selectively connected to the inputs of individual switches 502, where the switching operation of each individual switch to select one of the input voltages for output is controlled by a received modify signal 508. Each modify signal 508, and they may be different for different ones of the switches 502, comprises one of the control signals 344. Responsive to the modify signal 508, the individual switches 502 make an input to output voltage selection to generate the voltages which are selectively applied to individual cells within the sectors 340 (or to all cells in a sector, or to all cells in multiple sectors) in the PLD array 428.

As discussed above, in a preferred embodiment both the FLASH array 328 and the PLD array 428 are implemented using FLASH technology. Thus, the following example of voltage selection operation is applicable to both of the second switching circuits 242 and 342. An individual switch 502 within either of the second switching circuits 242 and 342 receives a VNEG voltage which is one of the voltages 226 generated by the power supply voltage generator 218 and a ground voltage. The switch 502 operates responsive to a received modify signal 506/508 to select one of the VNEG or ground voltages for output and application, to cells within a given sector 240/340 of the array 328/428, to the p-well within which the n-channel transistors of the word line driver are fabricated. This voltage selection is made depending on whether the cell is being read/programmed or erased. What should be noted with respect to this voltage selection operation is that the VNEG voltage is a power supply voltage generator 218 voltage that bypassed processing in the first switching circuit 232.

In another example which is also applicable to both of the second switching circuits 242 and 342, an individual switch 502 within either of the second switching circuits 242 and 342 receives the VXP_x voltage which is one of the voltages 234/334 output from the first switching circuit 232 and a ground voltage. The switch 502 operates responsive to a received modify signal 506/508 to select one of the VXP_x or ground voltages for output and application, to cells within a given sector 240/340 of the array 328/428, to the n-well within which the storage transistors of the memory cell array are fabricated. This voltage selection is made depending on whether the cell is being read/programmed/erased. What should be noted with respect to this voltage selection operation is that the VXP_x voltage is a voltage output from the first switching circuit 232.

Other examples of voltage selections to be made at the level of the second switching circuits 242/342 will be readily apparent to those skilled in the art. It will understood that the selections may be made among and between the voltages 226, 234 and 334.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A programmable system device, comprising:
   a FLASH memory module;
   a programmable logic device (PLD) module;
   a sole power supply voltage generator that generates programming, reading and erasing voltages for use by the FLASH memory module and the PLD module during programming, reading and erasing operations; and
   a switching network that receives at least some of the generated voltages and selectively chooses among and between the received generated voltages for application to the FLASH memory module and the PLD module depending on whether that particular module is engaged in programming, reading or erasing operations.

2. The device of claim 1 further comprising a load adjustment circuit that controls operation of the sole power supply voltage generator based on whether the generated voltages are being used by the FLASH memory module or the PLD module to account for differences in loading between the FLASH memory module and the PLD module during programming, reading and erasing operations.

3. The device of claim 2 wherein the differences in loading are caused at least in part by differences in size between the FLASH memory module and the PLD module.

4. The device of claim 2:
   wherein the FLASH memory module includes a circuit responsive to user selection for generating power supply operation commands indicative of whether programming, reading or erasing operations are to be performed by the FLASH memory module;
   wherein the PLD module includes a circuit responsive to user selection for generating power supply operation commands indicative of whether programming, reading or erasing operations are to be performed by the PLD module; and
   a FLASH/PLD interface logic circuit operating to arbitrate between the FLASH and PLD power supply operation commands before application to the sole power supply voltage generator.

5. The device of claim 4 wherein the load adjustment circuit operates responsive to the arbitrated FLASH and PLD power supply operation commands.

6. The device of claim 1 further comprising a voltage trimming circuit that controls operation of the sole power supply voltage generator to make adjustments in voltage level for at least some of the generated voltages depending on whether those generated voltages are being used by the FLASH memory module or the PLD module during programming, reading and erasing operations.

7. The device of claim 6:
   wherein the FLASH memory module includes a circuit responsive to user selection for generating power supply operation commands indicative of whether programming, reading or erasing operations are to be performed by the FLASH memory module;
   wherein the PLD module includes a circuit responsive to user selection for generating power supply operation commands indicative of whether programming, reading or erasing operations are to be performed by the PLD module; and
   a FLASH/PLD interface logic circuit operating to arbitrate between the FLASH and PLD power supply operation commands before application to the sole power supply voltage generator.

8. The device of claim 7 wherein the voltage trimming circuit operates responsive to the arbitrated FLASH and PLD power supply operation commands.

9. The device of claim 1:
   wherein the FLASH memory module includes a circuit responsive to user selection for generating power supply operation commands indicative of whether programming, reading or erasing operations are to be performed by the FLASH memory module;
   wherein the PLD module includes a circuit responsive to user selection for generating power supply operation commands indicative of whether programming, reading or erasing operations are to be performed by the PLD module; and
   a FLASH/PLD interface logic circuit operating to arbitrate between the FLASH and PLD power supply operation commands before application to the sole power supply voltage generator.

10. The device of claim 9 wherein the circuit for the FLASH memory module comprises:
    a FLASH user interface that receives user commands for FLASH memory module operation; and
    a power management logic circuit responsive to the interfaced module operation commands for generating the power supply operation commands indicative of whether programming, reading or erasing operations is to be performed by the FLASH memory module.

11. The device of claim 9 wherein the circuit for the PLD module comprises:
    a PLD user interface that receives user commands for PLD module operation; and
    a power management logic circuit responsive to the interfaced module operation commands for generating the power supply operation commands indicative of whether programming, reading or erasing operations is to be performed by the PLD module.

12. The device of claim 1 wherein at least one of the FLASH memory module and PLD module includes a plurality of cell banks.

13. The device of claim 1 wherein at least one of the FLASH memory module and PLD module includes a plurality of cell sectors.

14. A programmable system device, comprising:
a FLASH memory module;
a programmable logic device (PLD) module;
a sole power supply voltage generator that generates a plurality of voltages for use by the FLASH memory module and the PLD module during programming, reading and erasing operations; and
a load adjustment circuit that controls operation of the sole power supply voltage generator based on whether the generated voltages are being used by the FLASH memory module or the PLD module to account for differences in loading between the FLASH memory module and the PLD module during programming, reading and erasing operations.

15. The device of claim 14 further including a switching network that receives at least some of the generated voltages and selectively chooses among and between the received generated voltages for application to the FLASH memory module and the PLD module depending on whether that particular module is engaged in programming, reading or erasing operations.

16. The device of claim 14 wherein the differences in loading are caused at least in part by differences in size between the FLASH memory module and the PLD module.

17. The device of claim 14:
wherein the FLASH memory module includes a circuit responsive to user selection for generating power supply operation commands indicative of whether programming, reading or erasing operations are to be performed by the FLASH memory module;
wherein the PLD module includes a circuit responsive to user selection for generating power supply operation commands indicative of whether programming, reading or erasing operations are to be performed by the PLD module; and
a FLASH/PLD interface logic circuit operating to arbitrate between the FLASH and PLD power supply operation commands before application to the sole power supply voltage generator.

18. The device of claim 17 wherein the load adjustment circuit operates responsive to the arbitrated FLASH and PLD power supply operation commands.

19. A programmable system device, comprising:
a FLASH memory module;
a programmable logic device (PLD) module;
a sole power supply voltage generator that generates programming, reading and erasing voltages for use by the FLASH memory module and the PLD module during programming, reading and erasing operations; and
a voltage trimming circuit that controls operation of the sole embedded power supply voltage generator to make adjustments in voltage level for at least some of the generated voltages depending on whether those generated voltages are being used by the FLASH memory module or the PLD module during programming, reading and erasing operations.

20. The device of claim 19 further including a switching network that receives at least some of the generated voltages and selectively chooses among and between the received generated voltages for application to the FLASH memory module and the PLD module depending on whether that particular module is engaged in programming, reading or erasing operations.

21. The device of claim 19:
wherein the FLASH memory module includes a circuit responsive to user selection for generating power supply operation commands indicative of whether programming, reading or erasing operations are to be performed by the FLASH memory module;
wherein the PLD module includes a circuit responsive to user selection for generating power supply operation commands indicative of whether programming, reading or erasing operations are to be performed by the PLD module; and
a FLASH/PLD interface logic circuit operating to arbitrate between the FLASH and PLD power supply operation commands before application to the sole power supply voltage generator.

22. The device of claim 21 wherein the voltage trimming circuit operates responsive to the arbitrated FLASH and PLD power supply operation commands.

23. A programmable system device, comprising:
a FLASH memory module;
a programmable logic device (PLD) module;
a sole power supply voltage generator that generates a plurality of voltages for use by the FLASH memory module and the PLD module during programming, reading and erasing operations;
a load adjustment circuit that controls operation of the sole power supply voltage generator based on whether the generated voltages are being used by the FLASH memory module or the PLD module to account for differences in loading between the FLASH memory module and the PLD module during programming, reading and erasing operations; and
a voltage trimming circuit that controls operation of the sole embedded power supply voltage generator to make adjustments in voltage level for at least some of the generated voltages depending on whether those generated voltages are being used by the FLASH memory module or the PLD module during programming, reading and erasing operations.

24. The device of claim 23 further including a switching network that receives at least some of the generated voltages and selectively chooses among and between the received generated voltages for application to the FLASH memory module and the PLD module depending on whether that particular module is engaged in programming, reading or erasing operations.

25. The device of claim 23:
wherein the FLASH memory module includes a circuit responsive to user selection for generating power supply operation commands indicative of whether programming, reading or erasing operations are to be performed by the FLASH memory module;
wherein the PLD module includes a circuit responsive to user selection for generating power supply operation commands indicative of whether programming, reading or erasing operations are to be performed by the PLD module; and
a FLASH/PLD interface logic circuit operating to arbitrate between the FLASH and PLD power supply operation commands before application to the sole power supply voltage generator.

26. A programmable system device, comprising:
a FLASH memory module including a circuit responsive to user selection for generating power supply operation commands indicative of whether programming, reading or erasing operations are to be performed by the FLASH memory module;
a programmable logic device (PLD) module including a circuit responsive to user selection for generating power supply operation commands indicative of whether programming, reading or erasing operations are to be performed by the PLD module;

a sole power supply voltage generator that generates programming, reading and erasing voltages for use by the FLASH memory module and the PLD module during programming, reading and erasing operations; and a FLASH/PLD interface logic circuit operating to arbitrate between the FLASH and PLD power supply operation commands before application to the sole power supply voltage generator.

27. The device of claim 26 further comprising a load adjustment circuit that controls operation of the sole power supply voltage generator based on whether the generated voltages are being used by the FLASH memory module or the PLD module to account for differences in loading between the FLASH memory module and the PLD module during programming, reading and erasing operations.

28. The device of claim 26 further comprising a voltage trimming circuit that controls operation of the sole embedded power supply voltage generator to make adjustments in voltage level for at least some of the generated voltages depending on whether those generated voltages are being used by the FLASH memory module or the PLD module during programming, reading and erasing operations.

* * * * *

UNITED STATES PATENT AND TRADEMARK OFFICE
CERTIFICATE OF CORRECTION

PATENT NO.       : 7,180,813 B2                                        Page 1 of 1
APPLICATION NO.  : 11/012521
DATED            : February 20, 2007
INVENTOR(S)      : Stella Matarrese et al.

It is certified that error appears in the above-identified patent and that said Letters Patent is hereby corrected as shown below:

In the Specification:

At column 1, line number 29, please add the word -- of -- before the word 'positive'.
    At column 2, line number 10, please replace the word [the] with the word -- then --.
    At column 3, line number 9, please add the word -- of -- before the word 'positive'.
    At column 3, line number 28, please replace [0.8 volts] with -- -0.8 volts --.
    At column 3, line number 50, please replace the word [the] with the word -- then --.
    At column 6, line number 1, please add the word -- of -- before the word 'positive'.
    At column 7, line number 5, please add the word -- to -- before the word 'make'.
    At column 7, line number 56, please replace the word [the] with the word -- then --.

Signed and Sealed this
Thirteenth Day of September, 2011

David J. Kappos
*Director of the United States Patent and Trademark Office*